US009911485B2

(12) United States Patent
Sriramagiri et al.

(10) Patent No.: US 9,911,485 B2
(45) Date of Patent: Mar. 6, 2018

(54) METHOD AND APPARATUS FOR REFRESHING A MEMORY CELL

(71) Applicant: QUALCOMM Incorporated, San Diego, CA (US)

(72) Inventors: Deepti Vijayalakshmi Sriramagiri, San Diego, CA (US); Jung Pill Kim, San Diego, CA (US); Jungwon Suh, San Diego, CA (US); Xiangyu Dong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 14/244,173

(22) Filed: Apr. 3, 2014

(65) Prior Publication Data

US 2015/0134897 A1    May 14, 2015

Related U.S. Application Data

(60) Provisional application No. 61/902,550, filed on Nov. 11, 2013.

(51) Int. Cl.
*G06F 12/00* (2006.01)
*G11C 11/406* (2006.01)

(52) U.S. Cl.
CPC ...... *G11C 11/40618* (2013.01); *G11C 11/406* (2013.01); *G11C 11/40603* (2013.01); *G11C 11/40615* (2013.01); *G11C 11/40626* (2013.01); *G11C 2211/406* (2013.01)

(58) Field of Classification Search
None
See application file for complete search history.

(56) References Cited

U.S. PATENT DOCUMENTS

| 4,185,323 | A | * | 1/1980 | Johnson | G06F 13/1636 365/222 |
|---|---|---|---|---|---|
| 4,366,538 | A | | 12/1982 | Johnson et al. | |
| 6,392,948 | B1 | * | 5/2002 | Lee | G11C 11/406 365/201 |
| 6,735,139 | B2 | | 5/2004 | Tang | |
| 6,888,761 | B2 | * | 5/2005 | Afghahi et al. | 365/189.04 |
| 7,020,741 | B1 | * | 3/2006 | Tischler | 711/106 |
| 7,353,329 | B2 | * | 4/2008 | Ellis | G06F 13/1636 365/222 |
| 7,505,349 | B2 | * | 3/2009 | Hearn et al. | 365/222 |
| 7,782,698 | B2 | | 8/2010 | Kim | |
| 7,975,170 | B2 | | 7/2011 | Hummler et al. | |
| 8,462,560 | B2 | | 6/2013 | Furutani et al. | |
| 8,549,366 | B2 | | 10/2013 | Higeta et al. | |
| 2002/0051389 | A1 | * | 5/2002 | Mizugaki et al. | 365/200 |
| 2002/0057607 | A1 | * | 5/2002 | Mizugaki et al. | 365/200 |

(Continued)

OTHER PUBLICATIONS

International Search Report and Written Opinion for International Application No. PCT/US2014/063040, ISA/EPO, dated Jun. 16, 2015, 22 pages.

*Primary Examiner* — Reginald Bragdon
*Assistant Examiner* — Michael Westbrook
(74) *Attorney, Agent, or Firm* — Qualcomm Incorporated-Toler

(57) ABSTRACT

A method includes sending a first signal from a memory device to a memory controller. The first signal indicates to the memory controller that particular memory cells of the memory device are to be refreshed by the memory device.

30 Claims, 9 Drawing Sheets

(56) References Cited

U.S. PATENT DOCUMENTS

| | | | |
|---|---|---|---|
| 2002/0199056 A1* | 12/2002 | Ayukawa | G11C 11/005 711/106 |
| 2003/0067830 A1* | 4/2003 | Leung | G11C 7/22 365/222 |
| 2006/0044912 A1* | 3/2006 | Kim | G11C 7/1042 365/222 |
| 2006/0288154 A1* | 12/2006 | Huang et al. | 711/106 |
| 2007/0033338 A1* | 2/2007 | Tsern | 711/106 |
| 2007/0258306 A1* | 11/2007 | Riekels et al. | 365/222 |
| 2008/0062797 A1* | 3/2008 | Hearn et al. | 365/222 |
| 2008/0175086 A1* | 7/2008 | Luk et al. | 365/222 |
| 2010/0165692 A1* | 7/2010 | Jeddeloh | 365/51 |
| 2012/0099389 A1 | 4/2012 | Park et al. | |
| 2013/0279283 A1 | 10/2013 | Seo et al. | |
| 2014/0029367 A1 | 1/2014 | Jung et al. | |
| 2014/0071778 A1* | 3/2014 | Coteus | G11C 11/40611 365/222 |
| 2014/0078846 A1* | 3/2014 | Shin | G11C 11/40615 365/222 |

\* cited by examiner

METHOD AND APPARATUS FOR REFRESHING A MEMORY CELL

I. CLAIM OF PRIORITY

The present application claims priority from U.S. Provisional Patent Application No. 61/902,550, filed Nov. 11, 2013, entitled "METHOD AND APPARATUS FOR REFRESHING A MEMORY CELL," which is incorporated by reference in its entirety.

II. FIELD

The present disclosure is generally related to refreshing a memory cell.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

Wireless telephones may include volatile memory devices that include memory cells that are periodically refreshed to maintain data integrity. The volatile memory devices may "self-refresh" the memory cells using internal circuitry; however, the self-refresh process may cause different memory devices to be unavailable for access at different times due to each memory device refreshing according to its own schedule. Alternatively, a memory controller may control refreshing of the memory cells using an "auto-refresh" process. However, the auto-refresh process may disregard specific characteristics (e.g., temperature) of the volatile memory devices that can influence how often refresh operations should be performed to maintain data integrity. To ensure data integrity, the auto-refresh process may refresh the memory cells based on an industry standard that yields a large guard band (e.g., time interval between the actual refresh process and a refresh process based on the temperature of the volatile memory devices), which increases power consumption as memory devices are refreshed more frequently than needed.

IV. SUMMARY

Systems and methods for refreshing a memory cell by DRAM device are disclosed. Volatile memory devices (e.g., dynamic random access memory (DRAM) devices) may include mode registers to store retention profile information. The retention profile information may correspond to a refresh rates for particular memory cells within the volatile memory devices based on process variations and temperatures of the particular memory cells. For example, a first bank of memory cells of a volatile memory device may be associated with a first refresh rate of the first bank of memory cells, and a second bank of memory cells of the volatile memory device may be associated with a second refresh rate of the second bank of memory cells. A memory controller may poll the mode registers to determine a particular bank of memory cells (e.g., in a particular die) that has the shortest retention time (e.g., the required/recommended fastest refresh rate), and the memory controller may designate that particular bank of memory cells as a "master" die of a particular volatile memory device. Each volatile memory device may perform refresh operations on internal memory cells based on the refresh rate associated with the master die of the volatile memory device.

Prior to performing the refresh operations, the volatile memory devices may send refresh-ahead (RFA) signals to the memory controller via a sideband signaling channel (e.g., an RFA bus). For example, RFA signals may indicate to the memory controller that internal DRAM refresh operations are about to be performed. The internal DRAM refresh operations for each volatile memory device may be performed at a rate associated with the master die for each volatile memory device. In one embodiment, the memory controller may send an acknowledgment signal to the volatile memory devices that are about to perform the refresh operations. The acknowledgment signal indicates that the memory controller has discontinued issuing/executing commands associated with the volatile memory devices and that the volatile memory devices may perform the refresh operations in response to receiving the acknowledgment signal. In another embodiment, the memory controller may issue/execute commands associated with the volatile memory devices for a fixed time period after receiving the RFA signals. After the fixed time period expires, the memory controller may discontinue issuing/executing commands associated with the volatile memory devices, and the volatile memory devices may then perform refresh operations.

In a particular embodiment, an apparatus includes a memory device operable to send a first signal to a memory controller. The first signal indicates to the memory controller that particular memory cells of the memory device are to be refreshed by the memory device.

In another particular embodiment, a method includes sending a first signal from a memory device to a memory controller. The first signal indicates to the memory controller that particular memory cells of the memory device are to be refreshed by the memory device.

In another particular embodiment, an apparatus includes means for sending a first signal from a memory device to a memory controller. The first signal indicates to the memory controller that particular memory cells of the memory device are to be refreshed by the memory device. The apparatus also includes means for refreshing the particular memory cells.

In another particular embodiment, a non-transitory computer-readable medium includes instructions that, when executed by a processor within a memory device, causes the processor to send a first signal from the memory device to a memory controller. The first signal indicates to the memory controller that particular memory cells of the memory device are to be refreshed by the memory device. The instructions are also executable to cause the processor to initiate a refresh operation of the particular memory cells.

In another particular embodiment, an apparatus includes a memory controller operable to receive a first signal from a memory device. The first signal indicates to the memory controller that particular memory cells of the memory device are to be refreshed by the memory device.

In another particular embodiment, a method includes receiving, at a memory controller, a first signal from a memory device. The first signal indicates to the memory controller that particular memory cells of the memory device are to be refreshed by the memory device.

In another particular embodiment, an apparatus includes means for receiving a first signal from a memory device. The first signal indicates to the means for receiving that particular memory cells of the memory device are to be refreshed by the memory device. The apparatus also includes means for discontinuing execution of commands associated with the particular memory cells to enable refresh operations.

In another particular embodiment, a non-transitory computer-readable medium includes instructions that, when executed by a processor within a memory device, cause the processor to receive a first signal from a memory device. The first signal indicates to the memory controller that particular memory cells of the memory device are to be refreshed by the memory device. The instructions are also executable to cause the processor to discontinue execution of commands associated with the particular memory cells to enable refresh operations.

Particular advantages provided by at least one of the disclosed embodiments include an ability to reduce power consumption of volatile memory devices by refreshing memory cells based on retention profile and temperature of the volatile memory devices instead of refreshing all memory devices according to a "worst case" refresh time. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
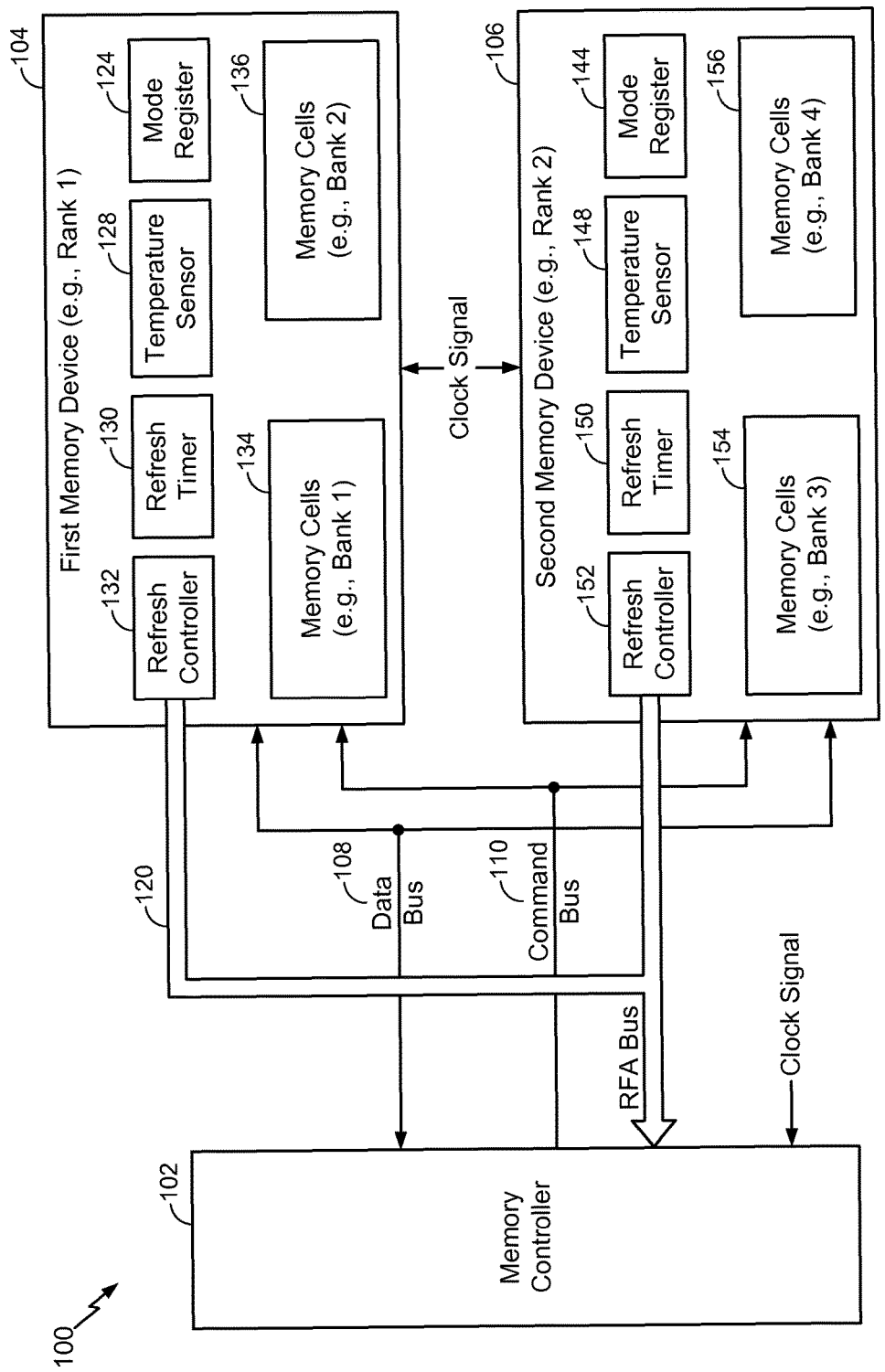
FIG. 1 is a diagram to illustrate a particular embodiment of a system that is operable to refresh memory cells.

Referring to FIG. 1, a particular embodiment of a system 100 that is operable to refresh memory cells is shown. The system 100 includes a memory controller 102, a first memory device 104 (e.g., a first rank), and a second memory device 106 (e.g., a second rank). The first memory device 104 and the second memory device 106 may be volatile memory devices. For example, the first memory device 104 and the second memory device 106 may be dynamic random access memory (DRAM) devices. The memory controller 102 may be coupled to the memory devices 104, 106 via a data bus 108 and via a command bus 110.

The first memory device 104 may include a first bank of memory cells 134 that stores first data and a second bank of memory cells 136 that stores second data. In a particular embodiment, the first bank of memory cells 134 and the second bank of memory cells 136 may correspond to DRAM cells. Particular memory cells within each bank of memory cells 134, 136 may be identified by rows and columns. Each memory cell may be refreshed, or re-energized, periodically at a particular rate in order to maintain data integrity (e.g., retain a stored data value). For example, the first and second banks of memory cells 134, 136 may be designed based on capacitors that store electrical charges, which may discharge over time. Refreshing may include recharging, or re-energizing, the capacitors.

The first memory device 104 may also include a first refresh controller 132 that is configured to generate retention time profile information of the first memory device 104. The retention time profile information includes data that indicates a first retention time of the first bank of memory cells 134 and a second retention time of the second bank of memory cells 136. For example, the retention time profile information may include data that corresponds to an amount of time the first bank of memory cells 134 may maintain data integrity without needing to be recharged (e.g., refreshed). The retention profile information may also include data that corresponds to an amount of time that the second bank of memory cells 136 may maintain data integrity without needing to be recharged. A first timer 130 may be configured to indicate to the first refresh controller 132 when a particular bank of memory cells 134, 136 needs to be refreshed based on the retention time profile information.

The first memory device 104 may also include a first temperature sensor 128. The first temperature sensor 128 may monitor a first temperature of the first bank of memory cells 134 and the second bank of memory cells 136. The first retention time is based at least in part on the first temperature of the memory cells 134, 136 and/or process variations associated with the memory cells 134, 136. For example, the first retention time may decrease as the first temperature increases.

The first memory device 104 may also include first dedicated data storage to store the retention time profile information. In a particular embodiment, the first dedicated data storage may be a first mode register 124. In another particular embodiment, the first dedicated data storage may be a serial presence detect (SPD) chip. As used herein, the term "dedicated data storage" and "mode register" may be used interchangeably. A "mode register" may refer to any chip, device, and/or register configured to store the retention time profile information and/or temperature information.

Initial (e.g., default) data associated with retention times for the banks of memory cells 134, 136 may be written to the first mode register 124 during manufacturing. As a non-limiting example, the first mode register 124 may indicate that the first and second banks of memory cells 134, 136 may maintain data integrity for 32 milliseconds (e.g., retention time) at a temperature of 75 degrees Fahrenheit. The first refresh controller 132 may adjust retention times of the banks of memory cells 134, 136 in response to temperature changes detected by the first temperature sensor 128. For example, the first temperature sensor 128 may detect a change in the first temperature, and the first refresh controller 132 may adjust the first retention time based on the detected change. The adjusted retention time may be written to the first mode register 124. As explained in greater detail with respect to FIG. 2, the memory controller 102 may periodically poll the first mode register 124 to determine a "master" die of the first memory device 104. For example, the illustrated embodiment in FIG. 1 depicts the first memory device 104 having a single die (e.g., including the first mode register 124, the first temperature sensor 128, the first refresh timer 130, the first refresh controller 132, and the memory cells 134, 136). However, in other embodiments (such as the embodiment depicted in FIG. 2), memory devices may include multiples dies.

The second memory device 106 may include a third bank of memory cells 154 that stores third data and a fourth bank of memory cells 156 that stores fourth data. In a particular embodiment, the third bank of memory cells 154 and the fourth bank of memory cells 156 may correspond to DRAM cells. The second memory device 106 may also include a second refresh controller 152, a second refresh timer 150, a second temperature sensor 148, and a second mode register 144. The second refresh controller 152, the second refresh timer 150, the second temperature sensor 148, and the second mode register 144 may operate in a substantially similar manner as described with respect to the first refresh controller 132, the first refresh timer 130, the first temperature sensor 128, and the first mode register 124, respectively.

The first refresh controller 132 may be configured to send a first signal (e.g., "refresh-ahead (RFA) information") from the first memory device 104 to the memory controller 102. The first signal may indicate to the memory controller 102 that particular memory cells of the first memory device 104 are to be refreshed by the first refresh controller 132. For example, the first refresh controller 132 may receive an indication from the first memory device 104, based on expiration of the first refresh timer 130, that the first bank of memory cells 134 needs to be refreshed, the second bank of memory cells 136 needs to be refreshed, or a combination thereof. The first signal may indicate to the memory controller 102 which bank of memory cells 134, 136 are to be refreshed. For purposes of the examples described below, the first signal may indicate that the first bank of memory cells 134 is to be refreshed. The first signal may be sent to the memory controller 102 via a dedicated bus (e.g., a side-band channel). For example, the first signal may be sent to the memory controller 102 via a RFA bus 120.

The memory controller 102 may receive the first signal via the RFA bus 120. In one embodiment, the memory controller 102 may complete execution of a set of commands associated with the first bank of memory cells 134. After completing execution of the set of commands, the memory controller 102 may be configured to discontinue execution of commands associated with the first bank of memory cells 134 for a refresh time period. For example, the memory controller 102 may be configured to send an acknowledgement signal to the first refresh controller 132 via the command bus 110 to indicate to the first refresh controller 132 that execution of commands associated with the first bank of memory cells 134 has been discontinued. The first refresh controller 132 may refresh the first bank of memory cells 134 upon receiving the acknowledgment signal from the memory controller 102. For example, the first refresh controller 132 may generate a voltage signal to charge capacitors of the first bank of memory cells 134 in response to receiving the acknowledgment signal. Charging the capacitors refreshes the first bank of memory cells 134.

In another embodiment, the first refresh controller 132 may be configured to suspend refresh operations associated with the first bank of memory cells 134 for a fixed time period in response to sending the first signal. The fixed time period may be programmed into the memory controller 102 and programmed into the memory devices 104, 106 (e.g., programmed by a manufacturer and/or defined by an industry standard). The memory controller 102 may be permitted to execute commands associated with the first bank of memory cells 134 for the fixed time period. For example, the memory controller 102 may execute a set of commands associated with the first bank of memory cells 134 for the fixed time period after receiving the first signal. In a particular embodiment, the memory controller 102 may include a timer to determine an expiration of the fixed time period. In another embodiment, the memory controller 102 may include a counter to count a particular number of clock cycles associated with the fixed time period. In response to the expiration of the fixed time period, the memory controller 102 discontinues execution of commands associated with the first bank of memory cells 134 and the first refresh controller 132 refreshes the first bank of memory cells 134.

The system 100 of FIG. 1 may enable a particular memory device to signal the memory controller 102 when a refresh operation needs to be performed, and the memory controller 102 may discontinue command execution associated with the particular memory device during refresh operations. The memory controller 102 may execute commands associated with other memory devices while refresh operations are undergone at the particular memory device. Thus, the system 100 may also improve processing efficiency as compared to a standard "self-refresh" mode. For example, the system 100 may enable the memory controller 102 to remain active and send commands to memory cells that are not undergoing a refresh operation while other memory cells are undergoing a refresh operation.

Figure 2:
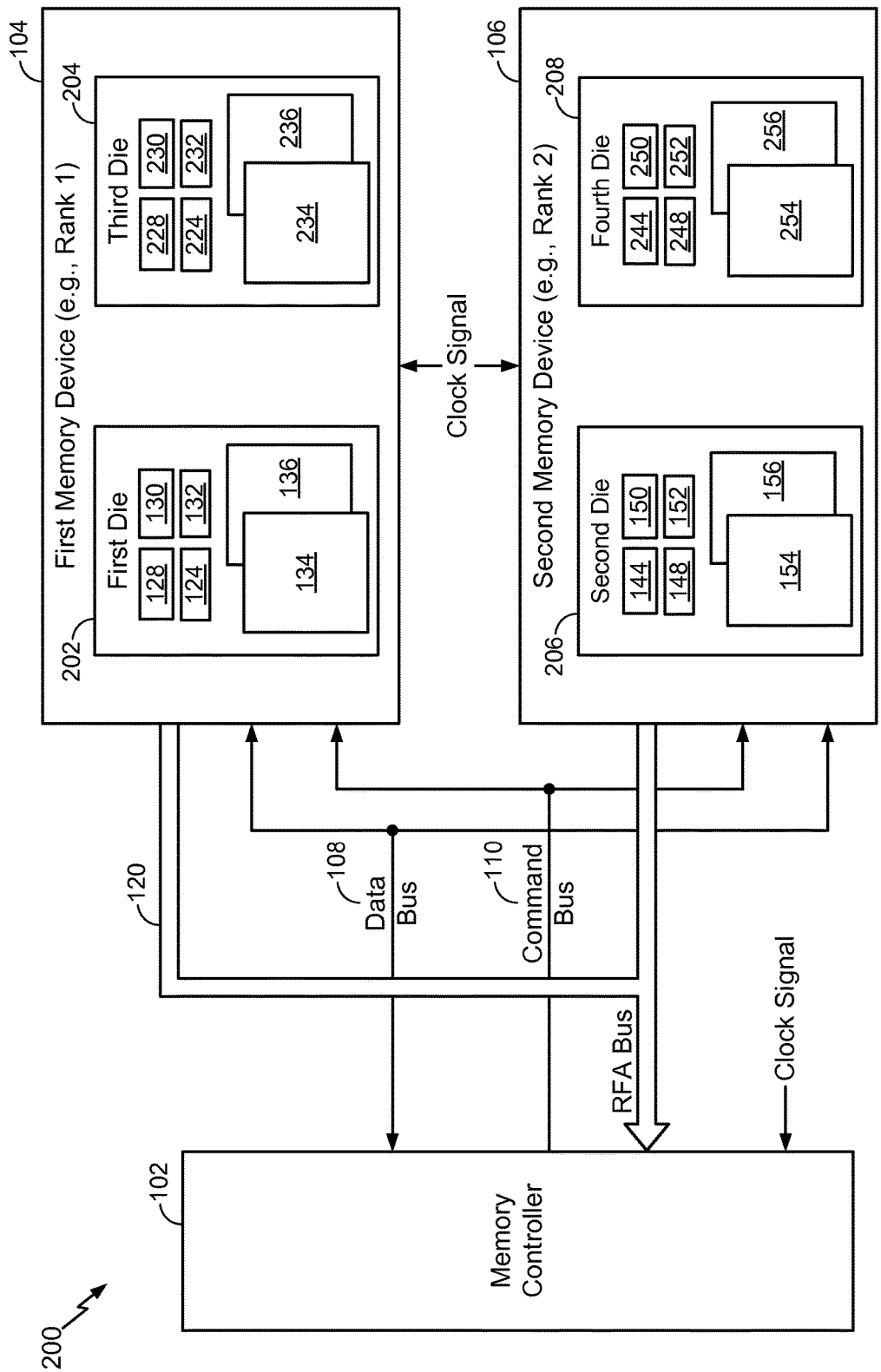
FIG. 2 is a diagram to illustrate another particular embodiment of a system that is operable to refresh memory cells.

Referring to FIG. 2, another particular embodiment of a system 200 that is operable to refresh memory cells is shown. The system 200 includes the memory controller 102, the first memory device 104, and the second memory device 106. The memory controller 102 may be coupled to the memory devices 104, 106 via the data bus 108 and via the command bus 110.

The first memory device 104 may include a first die 202 and a third die 204. Although the first memory device 104 includes two dies 202, 204 in the illustrated embodiment, in other embodiments, the first memory device 104 may include additional dies. For example, the first memory device may include K dies, where K is any integer greater than or equal to one.

The first die 202 may include the first mode register 124, the first temperature sensor 128, the first refresh timer 130, and the first refresh controller 132. The first die 202 may also include the first bank of memory cells 134 and the second bank of memory cells 136. Although the first die 202 includes two banks of memory cells 134, 136 in the illustrated embodiment, in other embodiments, the first die 202 may include additional banks of memory cells. For example, the first die 202 may include P banks of memory cells, where P is any integer greater than or equal to one. The third die 204 may include a third mode register 224, a third temperature sensor 228, a third refresh timer 230, and a third refresh controller 232. The third die 204 may also include multiple banks of memory cells 234, 236. The third mode register 224, the third temperature sensor 228, the third refresh timer 230, and the third refresh controller 232 may operate with respect to the third die 204 in a substantially similar manner as described with reference to FIG. 1 regarding the first mode register 124, the first temperature sensor 128, the first refresh timer 130, and the first refresh controller 132.

The first temperature sensor 128 may monitor a first temperature of the first and second banks of memory cells 134, 136 on the first die 202. The first retention time of the first and second banks of memory cells 134, 136 may be based at least in part on the first temperature and/or process variations associated with the first and second banks of memory cells 134, 136. As explained above with respect to FIG. 1, the first refresh controller 132 may be configured to generate retention time profile information that includes the first retention time. The first retention time may decrease as the first temperature increases. Additionally, process variations (e.g., capacitor sizes, etc.) may impact the first retention time. For example, retention times may increase as the size of the capacitors (e.g., the capacitance of the capacitors) in the first and second banks of memory cells 134, 136 increases. The first retention time may be stored in the first mode register 124. In a similar manner, the third temperature sensor 228 may monitor a third temperature of the banks of memory cells 234, 236 on the third die 204. A third retention time of the banks of memory cells 234, 236 is based at least in part on the third temperature and/or process variations associated with the banks of memory cells 234, 236. The third refresh controller 232 may be configured to generate retention time profile information that includes the third retention time. The third retention time may decrease as the third temperature increases. Additionally, process variations (e.g., capacitor sizes, etc.) may impact the third retention time in a substantially similar manner as described above. The third retention time may be stored in the third mode register 224.

The second memory device 106 may include a second die 206 and a fourth die 208. Although the second memory device 106 includes two dies 206, 208 in the illustrated embodiment, in other embodiments, the second memory device 106 may include additional dies. For example, the second memory device 106 may include N dies, where N is any integer greater than or equal to one.

The second die 206 may include the second mode register 144, the second temperature sensor 148, the second refresh timer 150, and the second refresh controller 152. The second die 206 may also include the third bank of memory cells 154 and the fourth bank of memory cells 156. Although the second die 206 includes two banks of memory cells 154, 156 in the illustrated embodiment, in other embodiments, the second die 206 may include additional banks of memory cells. For example, the second die 206 may include Q banks of memory cells, where Q is any integer greater than or equal to one. The fourth die 208 may include a fourth mode register 244, a fourth temperature sensor 248, a fourth refresh timer 250, and a fourth refresh controller 252. The fourth die 208 may also include multiple banks of memory cells 254, 256. The fourth mode register 244, the fourth temperature sensor 248, the fourth refresh timer 250, and the fourth refresh controller 252 may operate with respect to the fourth die 208 in a substantially similar manner as described with reference to FIG. 1 regarding the second mode register 244, the second temperature sensor 148, the second refresh timer 150, and the second refresh controller 152.

The second temperature sensor 148 may monitor a second temperature of the third and fourth banks of memory cells 154, 156 on the second die 206. The second retention time of the third and fourth banks of memory cells 154, 156 may be based at least in part on the second temperature and/or process variations associated with the third and fourth banks of memory cells 154, 156. The second refresh controller 152 may be configured to generate retention time profile information that includes the second retention time. The second retention time may decrease as the second temperature increases. Additionally, process variations (e.g., capacitor sizes, etc.) may impact the second retention time in a substantially similar manner as described above. In a similar manner, the fourth temperature sensor 248 may monitor a fourth temperature of the banks of memory cells 254, 256 on the fourth die 208. A fourth retention time of the banks of memory cells 254, 256 is based at least in part on the fourth temperature and/or process variations associated with the banks of memory cells 254, 256. The fourth refresh controller 252 may be configured to generate retention time profile information that includes the fourth retention time. The fourth retention time may decrease as the fourth temperature increases. Additionally, process variations (e.g., capacitor sizes, etc.) may impact the fourth retention time in a substantially similar manner as described above. The fourth retention time may be stored in the fourth mode register 244.

The memory controller 102 may be configured to access data stored in the mode registers 124, 144, 224, 244 via the data bus 108. In a particular embodiment, the data bus 108 may be a 32-bit bus configured to communicate 8 bits of data from each mode register 124 and 224 or 144 and 244. The memory controller 102 may be configured to periodically read the first retention time of the first die 202 and the third retention time of the third die 204 from the first mode register 124 and the third mode register 224, respectively. For example, the memory controller 102 may track retention time variations between the first die 202 and the third die 204 over time. The memory controller 102 may compare the first retention time to the third retention time and select a "master" die based on the comparison. As used herein, a master die corresponds to a die of a particular memory device that has the smallest retention time. For example, in response to a determination that the third retention time is greater than the first retention time, the memory controller 102 may select the first die 202 as the master die of the first memory device 104. Alternatively, the memory controller 102 may select the third die 204 as the master die of the first memory device 104 in response to a determination that the first retention time is greater than the third retention time.

In a similar manner, the memory controller 102 may be configured to periodically read the second retention time of the second die 206 and the fourth retention time of the fourth die 208 from the second mode register 144 and the fourth mode register 244, respectively. For example, the memory controller 102 may track retention time variations between the second die 206 and the fourth die 208 over time. The memory controller 102 may compare the second retention time to the fourth retention time and select a master die based on the comparison. For example, in response to a determination that the fourth retention time is greater than the second retention time, the memory controller 102 may select the second die 206 as the master die of the second memory device 106. Alternatively, the memory controller 102 may select the fourth die 208 as the master die of the second memory device 106 in response to a determination that the fourth retention time is greater than the second retention time.

Master dies may drive refresh ahead (RFA) side-band signaling. For example, the first refresh controller 132 may send a RFA signal (e.g., the first signal) to the memory controller 102 via the RFA bus 120 if the first die 202 is the master die of the first memory device 104. Similarly, the third refresh controller 232 may send the RFA signal to the memory controller 102 via the RFA bus 120 if the third die 204 is the master die of the first memory device 104. The RFA signal may indicate a request to the memory controller 102 to refresh the memory cells 134, 136, 234, 236 of the first memory device 104. The RFA signal may be sent to the memory controller 102 at times based on a refresh rate (e.g., a retention time) of the master die of the first memory device 104. The remaining dies of the first memory device 104 (e.g., dies that do not have the shortest retention times) are refreshed at the same rate (or at substantially the same rate) as the master die.

Similarly, the second refresh controller 152 may send a second RFA signal to the memory controller 102 via the RFA bus 120 if the second die 206 is the master die of the second memory device 106. The fourth refresh controller 252 may send the second RFA signal to the memory controller 102 via the RFA bus 120 if the fourth die 208 is the master die of the second memory device 106. The second RFA signal may indicate a request to the memory controller 102 to refresh the memory cells 154, 156, 254, 256 of the second memory device 106.

The system 200 of FIG. 2 may enable the first and second memory devices 104, 106 to perform internal refresh operations at a refresh rate that is based on a retention time of a master die of the first memory device 104 and a master die of the second memory device 106, respectively. For example, the system 200 may utilize the temperature sensors 128, 148, 228, 248 located on the memory devices 104, 106 to determine a retention time of each master die of the memory devices 104, 106. Thus, the retention times may be based on specific characteristics (e.g., temperatures and process variations) of the memory cells and may be longer than a standardized or "worst case" retention time, such as specified by a Joint Electron Device Engineering Council (JEDEC) standard (e.g., 32 millisecond refresh times). A particular memory device may signal to the memory controller 102 to request a refresh operation to be performed, and the memory controller 102 may discontinue command execution associated with the particular memory device during refresh operations. The memory controller 102 may execute commands associated with other memory devices while refresh operations are undergone at the particular memory device. Thus, the system 200 may improve processing efficiency as compared to a standard "self-refresh" mode. For example, the system 200 may enable the memory controller 102 to remain active and send commands to memory cells that are not undergoing a refresh operation while other memory cells are undergoing a refresh operation.

Figure 3:
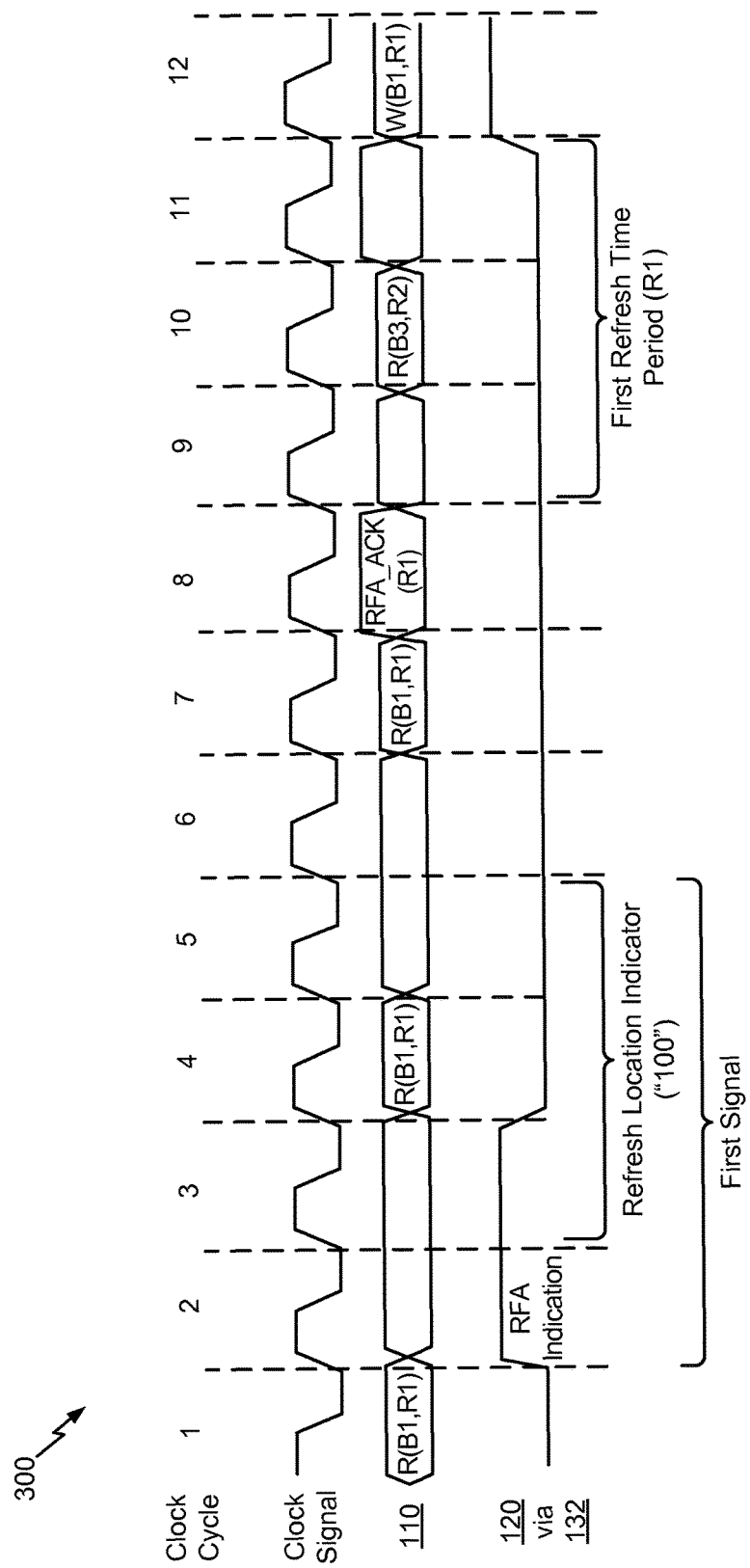
FIG. 3 is a timing diagram of a particular refresh scheme that uses an acknowledgement signal.

Referring to FIG. 3, a particular illustrative embodiment of a timing diagram 300 of a refresh scheme that uses an acknowledgement signal is shown. The timing diagram 300 is described with respect to the components of the system 100 of FIG. 1. For example, the timing diagram 300 depicts signaling activity on the command bus 110 and on the RFA bus 120 of the system 100 of FIG. 1 during a period of twelve clock cycles.

During the first clock cycle, the memory controller 102 may issue/execute a read command R(B1,R1) via the command bus 110 to read data stored in the first bank of memory cells 134 (B1) of the first memory device 104 (e.g., the first rank (R1)). During the second clock cycle, the first refresh controller 132 may send or assert the first signal (e.g., the RFA signal) to the memory controller 102 via the RFA bus 120. For example, a logical high voltage level signal (e.g., a logic "1") may be transmitted to the memory controller 102 via the RFA bus 120 during the second clock cycle to indicate that particular memory cells need to be refreshed (e.g., an "RFA Indication"). Information identifying which memory cells need to be refreshed may be serially transmitted on the RFA bus 120 after the initial logical high voltage level signal. For example, a "Refresh Location Indicator" may be serially transmitted to the memory controller 102 via the RFA bus 120 over the third, fourth, and fifth clock cycles. In the illustrative embodiment, the refresh location indicator ("100") may indicate that the memory cells that need to be refreshed are the first bank of memory cells 134 (B1) in the first rank (R1).

The memory controller 102 may continue executing commands associated with the first bank of memory cells 134 for a particular time period after receiving the first signal on the RFA bus 120. For example, during the third through seventh clock cycles, the memory controller 102 may issue/execute one or more read commands R(B1,R1) via the command bus 110 to read data stored in the first bank of memory cells 134. However, in response to finishing execution of all commands associated with the first bank of memory cells 134, the memory controller 102 may discontinue executing commands on the first bank of memory cells 134 and may issue a first acknowledgement signal to the first refresh controller 132. For example, in the illustrative embodiment, the memory controller 102 may issue the first acknowledgement signal RFA_ACK(R1) to the first refresh controller 132 via the command bus 110 during the eighth clock cycle. The first acknowledgement signal RFA_ACK(R1) may indicate to the first refresh controller 132 that execution of commands associated with the first rank (R1) (including the first bank of memory cells 134) has been discontinued for a first refresh time period (e.g., the ninth, tenth, and eleventh clock cycles).

During the first refresh time period, the first refresh controller 132 refreshes the first bank of memory cells 134 and the second bank of memory cells 136. Further, the memory controller 102 may execute other commands associated with other ranks (e.g., the second memory device 106) during the first refresh time period. For example, the memory controller 102 may execute a read command R(B3, R2) to read data located at the third bank of memory cells 154 (B3) in the second rank (R2) (e.g., the second memory device 106) during the tenth clock cycle.

After the first refresh time period expires (e.g., after the eleventh clock cycle), the memory controller 102 may resume issuing/executing commands associated with memory cells within the (now refreshed) first memory device 104. For example, the memory controller 102 may execute a write command W(B1,R1) to write data to the first bank of memory cells 134 of the first memory device 104.

Implementing the refresh scheme illustrated by the timing diagram 300 of FIG. 3 enables the memory controller 102 to execute commands to the second memory device 106 while the first memory device 104 is undergoing a refresh operation. For example, during the first refresh time period for the first rank, the memory controller 102 may remain active and issue commands (e.g., R(B3,R2)) to the second memory device 106. Thus, in scenarios where memory cells 134, 136 in the first memory device 104 and memory cells 154, 156 in the second memory device 106 have different retention times, the memory controller 102 may execute commands to one memory device while the other memory device is being refreshed.

Figure 4:
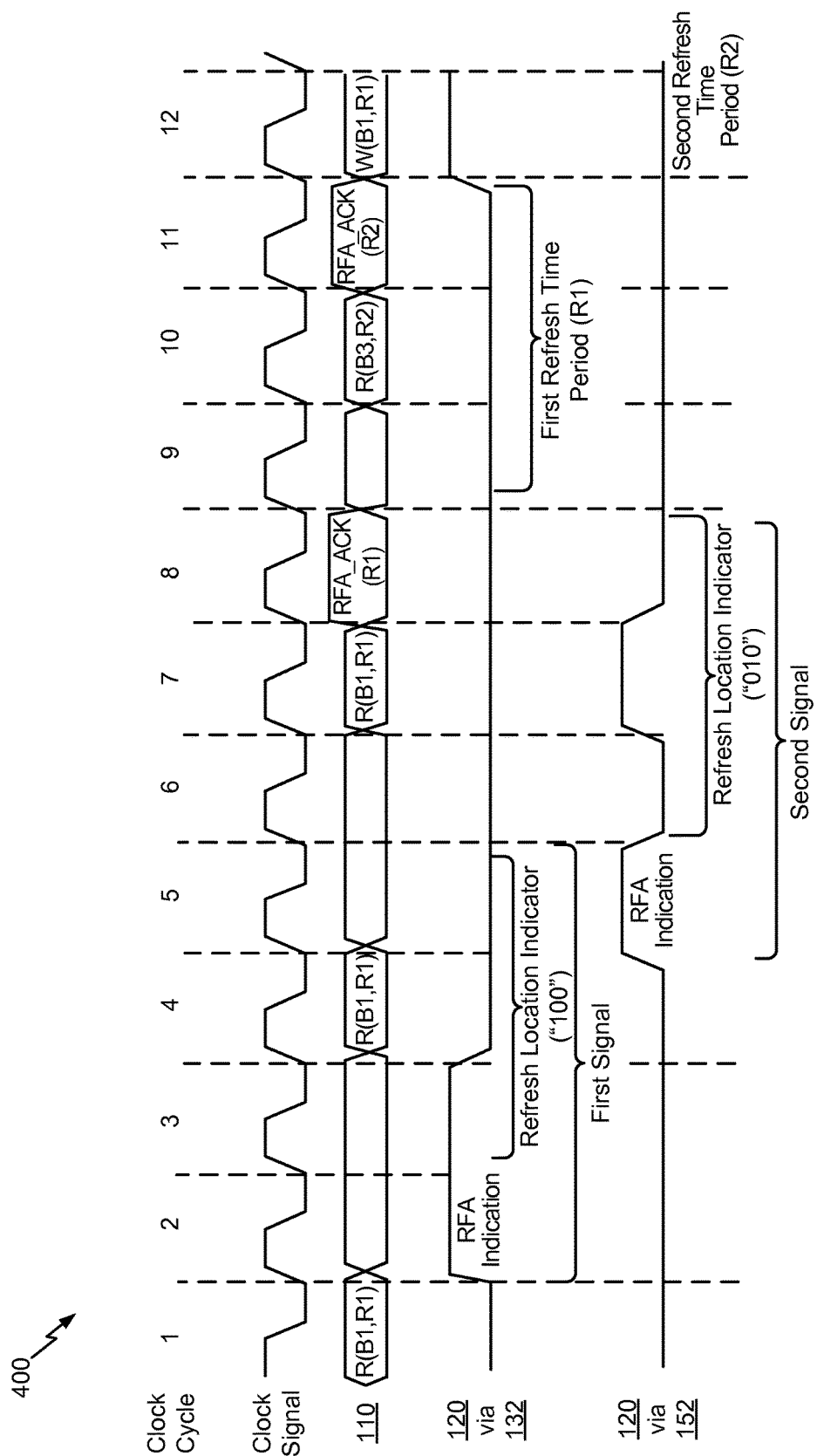
FIG. 4 is a timing diagram of another particular refresh scheme that uses an acknowledgment signal.

Referring to FIG. 4, another particular illustrative embodiment of a timing diagram 400 of a refresh scheme that uses an acknowledgment signal is shown. The timing diagram 400 is described with respect to the components of the system 100 of FIG. 1. The timing diagram 400 incorporates the signaling activity on the command bus 110 and the RFA bus 120 as described with respect to FIG. 3.

During the first through fourth clock cycles, activity on the RFA bus 120 may be associated with the first refresh controller 132 as described with respect to FIG. 3. During the fifth clock cycle, the second refresh controller 152 may send a second signal (e.g., an RFA signal) to the memory controller 102 via the RFA bus 120. For example, a logical high voltage level signal may be transmitted to the memory controller 102 via the RFA bus 120 during the fifth clock cycle to indicate that particular memory cells need to be refreshed (e.g., an "RFA Indication"). Information identifying which memory cells need to be refreshed may be serially transmitted on the RFA bus 120 after the initial logical high voltage level signal. For example a "Refresh Location Indicator ("(010)")" may be serially transmitted to the memory controller 102 via the RFA bus 120 over the sixth, seventh, and eighth clock cycles. In the illustrative embodiment, the refresh location indicator ("010") may indicate that the memory cells that need to be refreshed are the fourth bank of memory cells 156 (B4) in the second rank (R2) (e.g., the second memory device 106).

In the illustrative embodiment, the first RFA signal from the first refresh controller 132 and the second RFA signal from the second refresh controller 152 may overlap. For example, the first RFA signal may be a 4-bit signal transmitted over the second, third, fourth, and fifth clock cycles, as described with respect to FIG. 3. The second RFA signal may be a 4-bit signal transmitted over the fifth, sixth, seventh, and eighth clock cycles. In this scenario, the memory controller 102 may delay sending a second acknowledgment signal (associated with the second RFA signal) to the second refresh controller 152 to stagger refresh operations between the first memory device 104 and the second memory device 106. For example, the memory controller 102 may issue a second acknowledgement signal RFA_ACK(R2) to the second refresh controller 152 via the command bus 110 during the eleventh clock cycle (e.g., the last clock cycle of the first refresh time period). The second acknowledgement signal RFA_ACK(R2) indicates to the second refresh controller 152 that execution of commands associated with the second rank (R2) (including the fourth bank of memory cells 156) has been discontinued for a second refresh time period. The second refresh time period for the second rank (R2) may begin after the first refresh time period ends (e.g., after the eleventh clock cycle). During the second refresh time period, the second refresh controller 152 may refresh the third bank of memory cells 154 and the fourth bank of memory cells 156 while the first and second banks of memory cells 134, 136 are available for read/write operations.

Implementing the refresh scheme illustrated by the timing diagram 400 of FIG. 4 may enable enhanced system performance. For example, staggering the refresh operations of the first memory device 104 and the second memory device 106 enables the memory controller 102 to continuously execute commands to one memory device 104, 106 while the other memory device 104, 106 is undergoing refresh operations.

Figure 5:
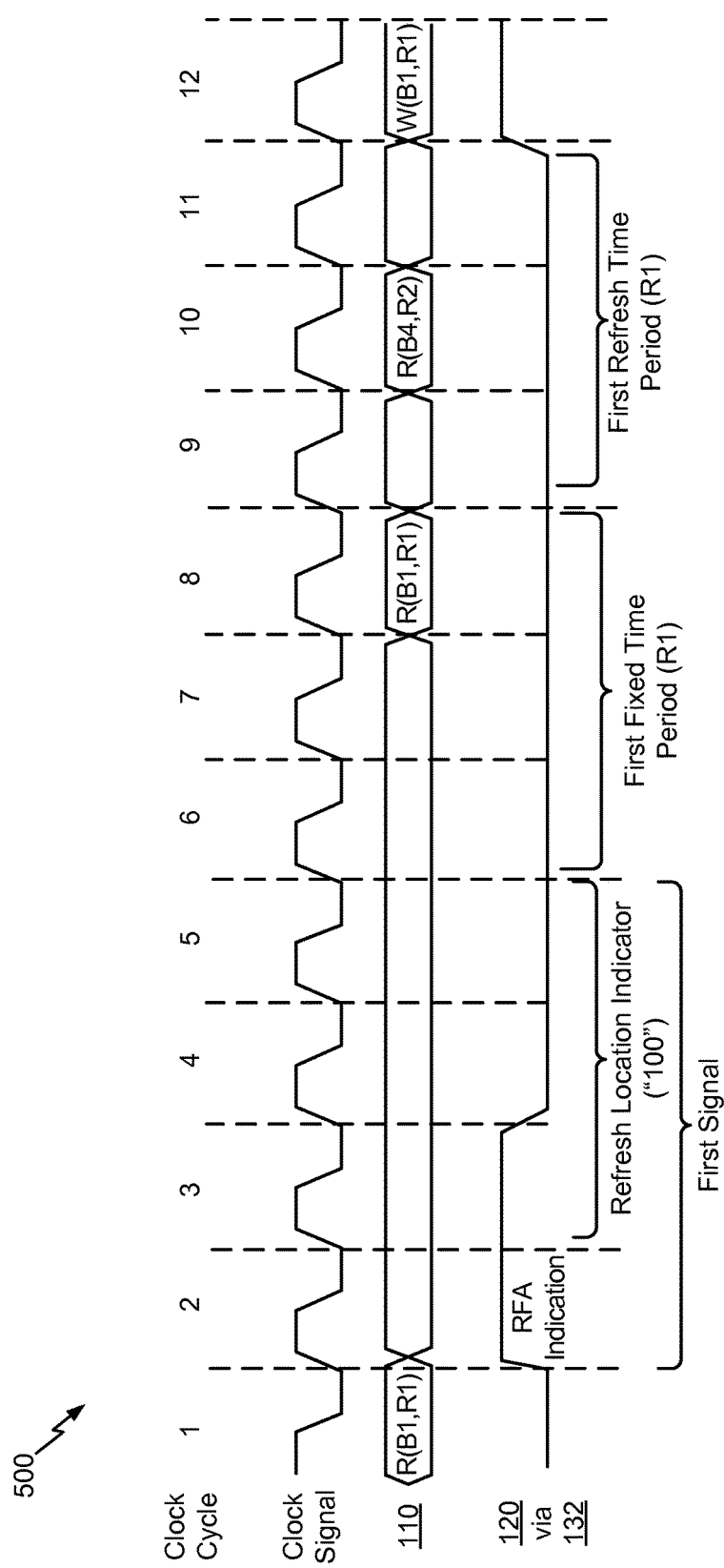
FIG. 5 is a timing diagram of a particular refresh scheme that uses a fixed timer.

Referring to FIG. 5, a particular illustrative embodiment of a timing diagram 500 of a refresh scheme using a fixed timer is shown. The timing diagram 500 is described with respect to the components of the system 100 of FIG. 1. For example, the timing diagram 500 depicts signaling activity on the command bus 110 and the RFA bus 120 of the system 100 of FIG. 1 during a period of twelve clock cycles.

Operations in first through fifth clock cycles may proceed as described with reference to FIG. 3. Whereas in FIG. 3 the first refresh controller 132 waits for an acknowledgement signal before performing refreshes, in FIG. 5, the first refresh controller 132 is configured to suspend refresh operations for a first fixed time period in response to sending the first signal and begins refreshes after the first fixed time period. For example, the first refresh controller 132 may suspend refresh operations during the sixth, seventh, and eighth clock cycles. The first fixed time period may be programmed into the memory controller 102 and programmed into the first memory device 104 during manufacturing. In the illustrative embodiment of FIG. 5, the first fixed time period is three clock cycles. During the first fixed time period, the memory controller 102 may issue/execute commands associated with the first bank of memory cells 134. For example, in the illustrative embodiment, the memory controller 102 may issue/execute a read command R(B1,R1) via the command bus 110 during the eighth clock cycle (e.g., during the first fixed time period) to read data stored in the first bank of memory cells 134. The first memory device 104 may also execute commands associated with the first bank of memory cells 134 during the first fixed time period.

At the expiration of the first fixed time period, the memory controller 102 may be configured to automatically discontinue execution of commands associated with the first bank of memory cells 134 and the first refresh controller 132 may be configured to automatically begin refreshing the first bank of memory cells 134 and the second bank of memory cells 136. For example, at the end of the eighth clock cycle, the memory controller 102 may discontinue executing commands to the first rank (e.g., the first memory device 104) for a first refresh time period. During the first refresh time period (e.g., the ninth, tenth, and eleventh clock cycles), the first refresh controller 132 may refresh the first bank of memory cells 134 and the memory controller 102 may issue/execute commands to other ranks. For example, the memory controller 102 may issue a read command R(B4, R2) to read data in the fourth bank of memory cells 156 of the second memory device 106 during the tenth clock cycle.

After the first refresh time period expires (e.g., after the eleventh clock cycle), the memory controller 102 may issue other commands to the first memory device 104. For example, the memory controller 102 may execute a write command W(B1,R1) to write data to the first bank of memory cells 134 of the first memory device 104. The first refresh controller 132 may assert another RFA signal to the memory controller 102 via the RFA bus 120 after the first refresh time period.

Implementing the refresh scheme illustrated by the timing diagram 500 of FIG. 5 reduces traffic on the command bus 110 by foregoing communication of an acknowledgement signal to the first refresh controller 132. For example, utilizing the first fixed time period to initiate refresh operations enables the memory controller 102 to issue commands (e.g., R(B1,R1)) to the first bank of memory cells 134 during the eighth clock cycle as opposed to issuing an acknowledgment signal during the eighth clock cycle, as described with respect to FIG. 3.

Figure 6:
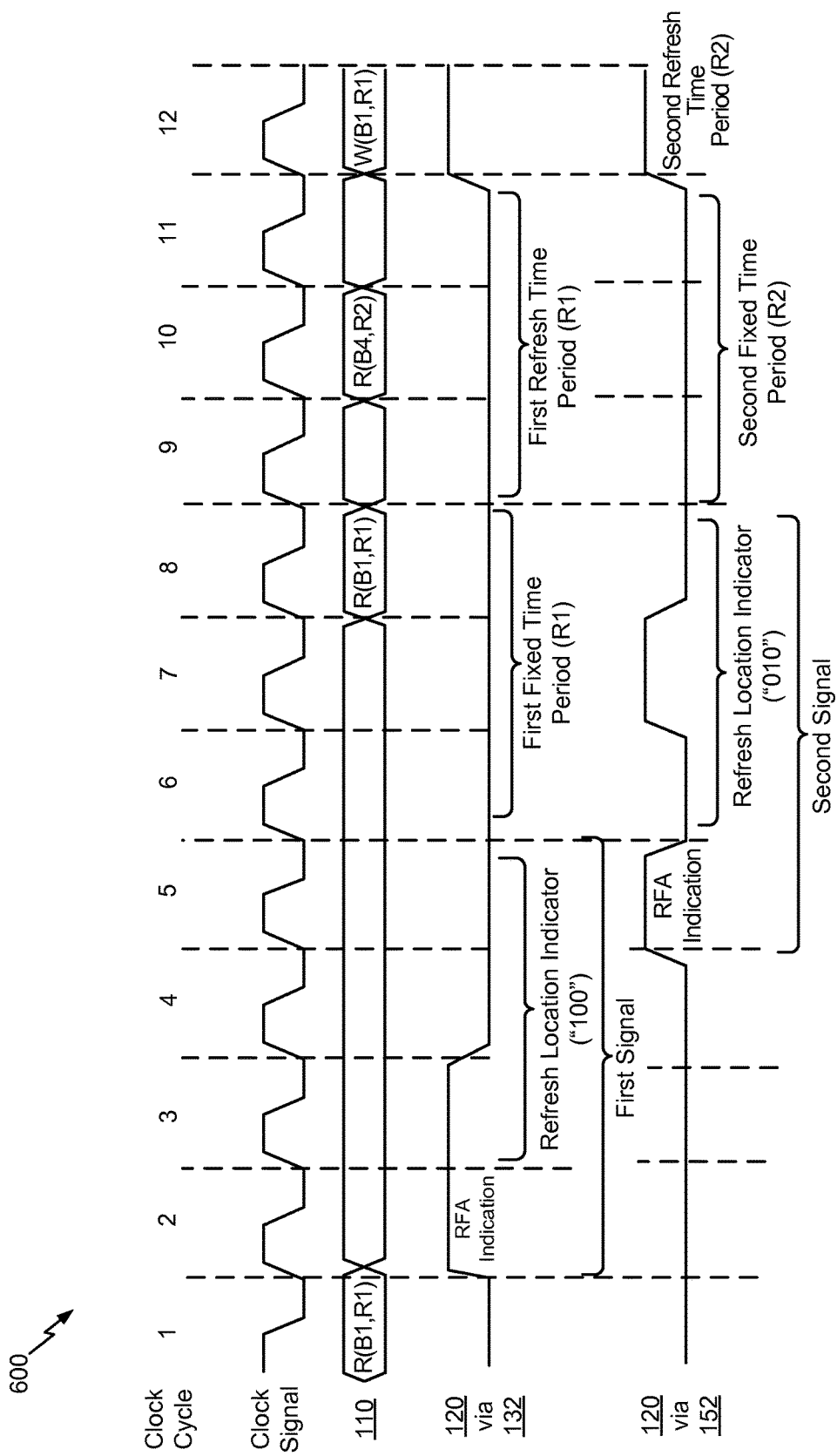
FIG. 6 is a timing diagram of another particular refresh scheme that uses a fixer timer.

Referring to FIG. 6, another particular illustrative embodiment of a timing diagram 600 of a refresh scheme using a fixed timer is shown. The timing diagram 600 is described with respect to the components of the system 100 of FIG. 1. The timing diagram 600 incorporates the signaling activity on the command bus 110 and the RFA bus 120 as described with respect to FIG. 5.

During the first through fourth clock cycles, activity on the RFA bus 120 may be associated with the first refresh controller 132 as described with respect to FIG. 5. During the fifth clock cycle, the second refresh controller 152 may send a second signal (e.g., an RFA signal) to the memory controller 102 via the RFA bus 120. For example, a logical high voltage level signal may be transmitted to the memory controller 102 via the RFA bus 120 during the fifth clock cycle to indicate that particular memory cells need to be refreshed. Information identifying which memory cells need to be refreshed may be serially transmitted on the RFA bus 120 after the initial logical high voltage level signal. For example a "Refresh Location Indicator (("010"))" may be serially transmitted to the memory controller 102 via the RFA bus 120 over the sixth, seventh, and eighth clock cycles. In the illustrative embodiment, the refresh location indicator ("010") may indicate that the memory cells that need to be refreshed are the fourth bank of memory cells 156 (B4) in the second rank (R2) (e.g., the second memory device 106).

The second refresh controller 152 may be configured to suspend refresh operations for a second fixed time period in response to sending the second signal. For example, the second refresh controller 152 may suspend refresh operations during the ninth, tenth, and eleventh clock cycles (e.g., during the first refresh time period). The second fixed time period may be programmed into the memory controller 102 and programmed into the second memory device 106 during manufacturing. During the second fixed time period, the memory controller 102 may issue/execute commands associated with the fourth bank of memory cells 156. For example, in the illustrative embodiment, the memory controller 102 may issue/execute a read command R(B4,R2) via the command bus 110 during the tenth clock cycle to read data stored in the fourth bank of memory cells 156 (B4). The second memory device 106 may also execute commands associated with fourth bank of memory cells 156 during the second fixed time period.

At the expiration of the second fixed time period, the memory controller 102 is configured to discontinue execution of commands associated with the fourth bank of memory cells 156, and the second refresh controller 152 is configured to refresh the fourth bank of memory cells 156. For example, at the end of the eleventh clock cycle, the memory controller 102 may discontinue executing commands to the second rank (e.g., the second memory device 106) for a second refresh time period. During the second refresh time period, the second refresh controller 152 may refresh the fourth bank of memory cells 156, and the memory controller 102 may issue/execute commands to other ranks. For example, the memory controller 102 may issue a write command W(B1,R1) to write data in the first bank of memory cells 134 of the first memory device 104.

Implementing the refresh scheme illustrated by the timing diagram 600 of FIG. 6 may enable enhanced system performance. For example, staggering the refresh operations of the first memory device 104 and the second memory device 106 enables the memory controller 102 to continuously execute commands to one memory device 104, 106 while the other memory device 104, 106 is undergoing refresh operations.

Figure 7:
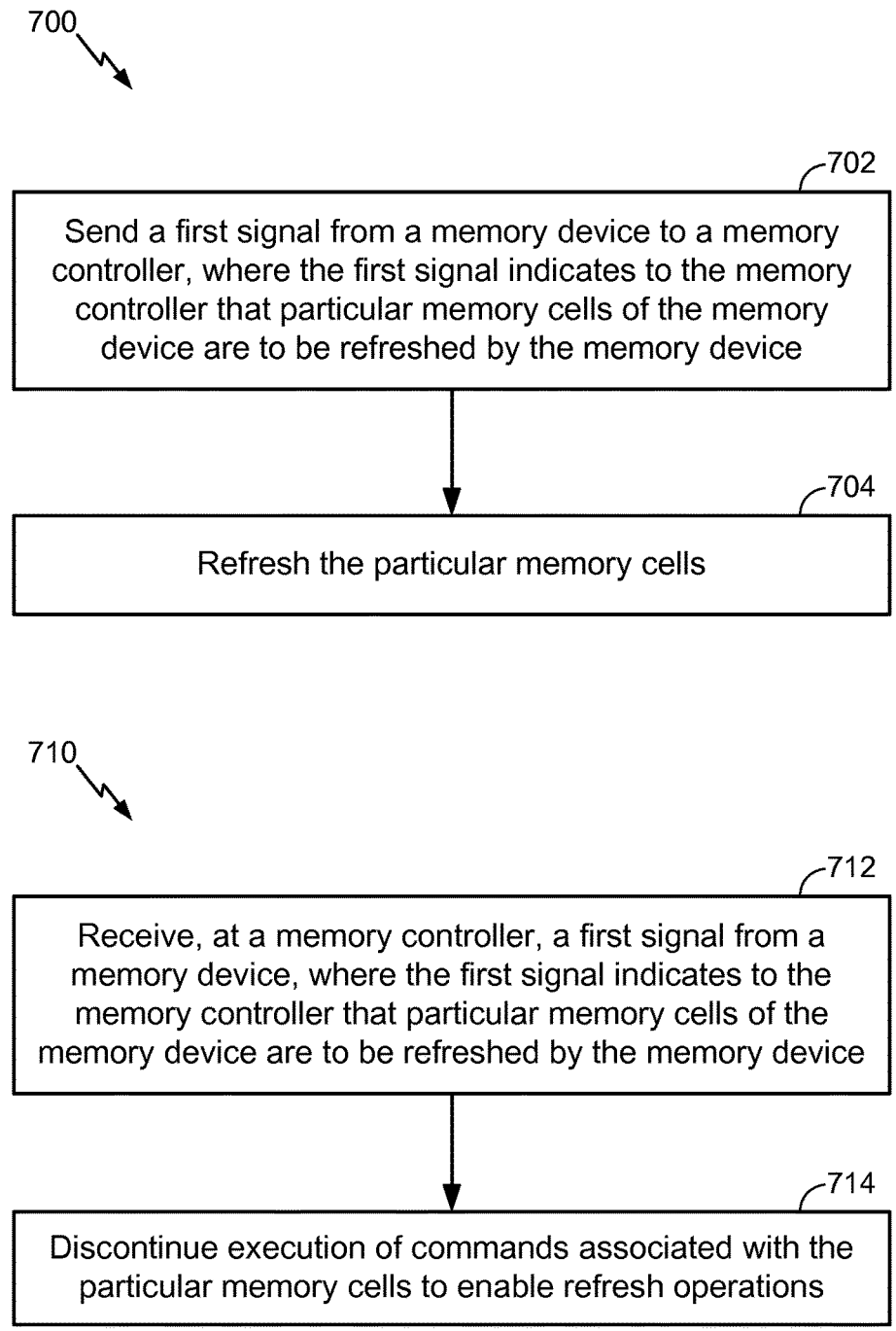
FIG. 7 depicts flowcharts to illustrate particular embodiments of methods for refreshing a memory cell.

Referring to FIG. 7, flowcharts to illustrate particular embodiments of methods 700, 710 for refreshing memory cells is shown. A first method 700 of FIG. 7 may be performed by a memory device, such as the first memory device 104 of FIG. 1 and/or the second memory device 106 of FIG. 1. A second method 710 of FIG. 7 may be performed by a memory controller, such as the memory controller 102 of FIGS. 1-2.

The first method 700 may include sending a first signal from a memory device to a memory controller, at 702. For example, the first refresh controller 132 of FIG. 1 may send the first signal (e.g., the RFA signal) from the first memory device 104 to the memory controller 102. The first signal may indicate to the memory controller 102 that particular memory cells of the first memory device 106 are to be refreshed by the first refresh controller 132. For example, the first signal may indicate to the memory controller 102 which bank of memory cells 134, 136 are to be refreshed. As described with respect to FIGS. 3-6, the first signal may include the refresh location indicator ("100") to indicate that the memory cells that need to be refreshed are the first bank of memory cells 134 (B1) in the first rank (R1).

The first method 700 further includes refreshing the particular memory cells, at 704. For example, in a particular embodiment, the first refresh controller 132 may refresh the first bank of memory cells 134 in response to receiving an acknowledgment signal from the memory controller 102. For example, as described with respect to FIGS. 2-3, the memory controller 102 issues the first acknowledgement signal RFA_ACK(R1) to the first refresh controller 132 via the command bus 110 during the eighth clock cycle. The first acknowledgement signal RFA_ACK(R1) indicates to the first refresh controller 132 that execution of commands associated with the first rank (R1) (including the first bank of memory cells 134) has been discontinued for the first refresh time period (e.g., the ninth, tenth, and eleventh clock cycles). During the first refresh time period, the first refresh controller 132 may refresh the first bank of memory cells 134.

In another particular embodiment, the first refresh controller 132 may refresh the first bank of memory cells 134 in response to an expiration of a fixed time period. For example, as described with respect to FIGS. 5-6, at the expiration of the first fixed time period, the memory controller 102 discontinues execution of commands associated with the first bank of memory cells 134, and the first refresh controller 132 refreshes the first bank of memory cells 134. For example, at the end of the eighth clock cycle, the memory controller 102 discontinues executing commands to the first rank (e.g., the first memory device 104) for the first refresh time period. During the first refresh time period (e.g., the ninth, tenth, and eleventh clock cycles), the first refresh controller 132 refreshes the first bank of memory cells 134, and the memory controller 102 may issue/execute commands to other ranks.

While the first method 700 may be performed by at least one of the memory devices 104, 106 of FIG. 1, the second method 710 may be performed by the memory controller 102 of FIG. 1. The second method 710 may include receiving, at a memory controller, a first signal from a memory device, at 712. For example, in FIG. 1, the memory controller 102 may receive the first signal (e.g., the RFA signal) via the RFA bus 120. The first signal may indicate to the memory controller 102 that particular memory cells of the first memory device 106 are to be refreshed by the first refresh controller 132. For example, the first signal may indicate to the memory controller 102 which bank of memory cells 134, 136 are to be refreshed. As described with respect to FIGS. 2-5, the first signal may include the refresh location indicator ("100") to indicate that the memory cells that need to be refreshed are the first bank of memory cells 134 (B1) in the first rank (R1).

Execution of commands associated with the particular memory cells may be discontinued to enable refresh operations, at 712. For example, the memory controller 102 may coordinate execution of commands associated with the particular memory cells with refresh operations associated with the particular memory cells so as not to execute the commands when the particular memory cells are undergoing a refresh operation. In a particular embodiment, the memory controller 102 may send an acknowledgment signal to the first memory device 104 to indicate that commands to the first memory device 104 have been discontinued for a refresh time period. As described with respect to FIG. 2, the memory controller 102 issues the first acknowledgement signal RFA_ACK(R1) to the first refresh controller 132 via the command bus 110 during the eighth clock cycle. The first acknowledgement signal RFA_ACK(R1) indicates to the first refresh controller 132 that execution of commands associated with the first rank (R1) (including the first bank of memory cells 134) has been discontinued for the first refresh time period (e.g., the ninth, tenth, and eleventh clock cycles). During the first refresh time period, the first refresh controller 132 may refresh the first bank of memory cells 134.

In another particular embodiment, the memory controller 102 may execute commands associated with the particular memory cells for a fixed time period after receiving the first signal and discontinue execution in response to an expiration of the fixed time period. As described with respect to FIG. 5, the memory controller 102 may issue/execute commands associated with the first bank of memory cells 134 during the first fixed time period. For example, the memory controller 102 issues a read command R(B1, R1) via the command bus 110 during the eighth clock cycle (e.g., during the first fixed time period) to read data stored in the first bank of memory cells 134. At the expiration of the first fixed time period, the memory controller 102 discontinues execution of commands associated with the first bank of memory cells 134 and the first refresh controller 132 refreshes the first bank of memory cells 134.

The methods 700, 710 of FIG. 7 may improve processing efficiency as compared to a standard "self-refresh" mode. For example, the methods 700, 710 enable the memory controller 102 to remain active and send commands to memory cells that are not undergoing a refresh operation while particular memory cells are undergoing a refresh operation.

In particular embodiments, the methods 700, 710 of FIG. 7 may be implemented via hardware (e.g., a field-programmable gate array (FPGA) device, an application-specific integrated circuit (ASIC), etc.) of a processing unit, such as a central processing unit (CPU), a digital signal processor (DSP), or a controller, via a firmware device, or any combination thereof. As an example, the methods 700, 710 can be performed by a processor that executes instructions. FIGS. 1-7 thus illustrate examples including a system, refresh schemes, and methods that refresh memory cells of a memory device.

Figure 8:
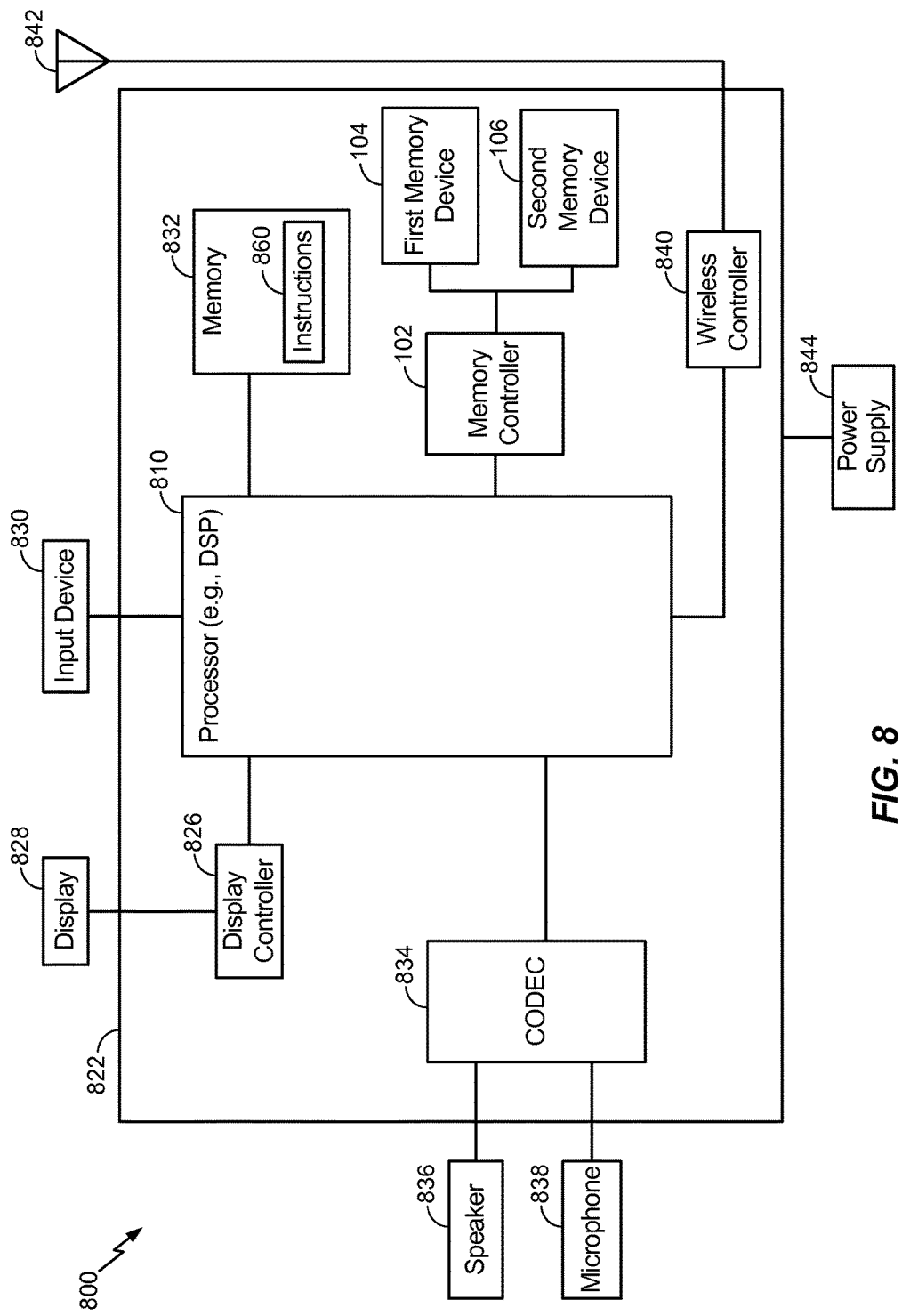
FIG. 8 is a block diagram of a wireless device operable to perform memory cell refreshing operations in accordance with the systems, refresh schemes, and methods of FIGS. 1-7.

Referring to FIG. 8, a block diagram of a particular illustrative embodiment of a wireless communication device is depicted and generally designated 800. The device 800 includes a processor 810 (e.g., a central processing unit (CPU), a digital signal processor (DSP), etc.) coupled to a memory 832. The memory 832 may include instructions 860 executable by the processor 810 and/or the memory controller 102 of FIGS. 1-2 to perform methods and processes disclosed herein, such as the methods of FIG. 7 and the refresh schemes disclosed in FIGS. 3-6.

The memory 832 may be a memory device, such as a random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). The memory device may include instructions (e.g., the instructions 860) that, when executed by a computer (e.g., the memory controller 120 and/or the processor 810), may cause the computer to perform at least a portion of the methods 700, 710 of FIG. 7. The first memory device 104 of FIGS. 1-2 and the second memory device 106 of FIGS. 1-2 may be coupled to the memory controller 102. Although two memory devices 104, 106 are illustrated, in other embodiments, additional memory devices may be coupled to the memory controller 102. As a non-limiting example, seven additional memory devices may be coupled to the memory controller 102.

FIG. 8 also shows a display controller 826 that is coupled to the processor 810 and to a display 828. An encoder/decoder (CODEC) 834 may be coupled to the processor 810, as shown. A speaker 836 and a microphone 838 can be coupled to the CODEC 834. FIG. 8 also shows a wireless controller 840 coupled to the processor 810 and to an antenna 842. In a particular embodiment, the processor 810, the display controller 826, the memory 832, the CODEC 834, and the wireless controller 840 are included in a system-in-package or system-on-chip device (e.g., a mobile station modem (MSM)) 822. In a particular embodiment, an input device 830, such as a touchscreen and/or keypad, and a power supply 844 are coupled to the system-on-chip device 822. Moreover, in a particular embodiment, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 can be coupled to a component of the system-on-chip device 822, such as an interface or a controller.

In conjunction with the described embodiments, a first apparatus includes means for sending a first signal (e.g., an RFA signal) from a memory device to a memory controller. The first signal indicates to the memory controller that particular memory cells of the memory device are to be refreshed by the memory device. For example, the means for sending the first signal may include the first refresh controller 132 of FIGS. 1-2, the second refresh controller 152 of FIGS. 1-2, the third refresh controller 232 of FIG. 2, the fourth refresh controller 252 of FIG. 2, the first memory device 104 of FIGS. 1-2, the second memory device 106 of FIGS. 1-2, the RFA bus of FIGS. 1-2, one or more other devices, circuits, modules, or instructions to send the first signal, or any combination thereof.

The first apparatus may also include means for refreshing the particular memory cells. For example, the means for refreshing the particular memory cells may include the first refresh controller 132 of FIGS. 1-2, the first refresh timer 130 of FIGS. 1-2, the second refresh controller 152 of FIGS. 1-2, the second refresh timer 150 of FIGS. 1-2, the third refresh controller 232 of FIG. 2, the third refresh timer 230 of FIG. 2, the fourth refresh controller 252 of FIG. 2, the fourth refresh timer 550 of FIG. 2, the first memory device 104 of FIGS. 1-2, the second memory device 106 of FIGS.

1-2, one or more other devices, circuits, modules, or instructions to refresh the particular memory cells, or any combination thereof.

In conjunction with the described embodiments, a second apparatus includes means for receiving a first signal (e.g., an RFA signal) from a memory device. The first signal indicates to the means for receiving that particular memory cells of the memory device are to be refreshed by the memory device. The means for receiving the first signal may include the memory controller 102 of FIGS. 1-2, the RFA bus 120 of FIGS. 1-2, one or more other devices, circuits, modules, or instructions to receive the first signal, or any combination thereof.

The second apparatus may also include means for discontinuing execution of commands associated with the particular memory cells to enable refresh operations. For example, the means for discontinuing execution of commands associated with the particular memory cells may include the memory controller 102 of FIGS. 1-2, the command bus 110 of FIGS. 1-2, one or more other devices, circuits, modules, or instructions to discontinue execution of commands associated with the particular memory cells, or any combination thereof.

Figure 9:
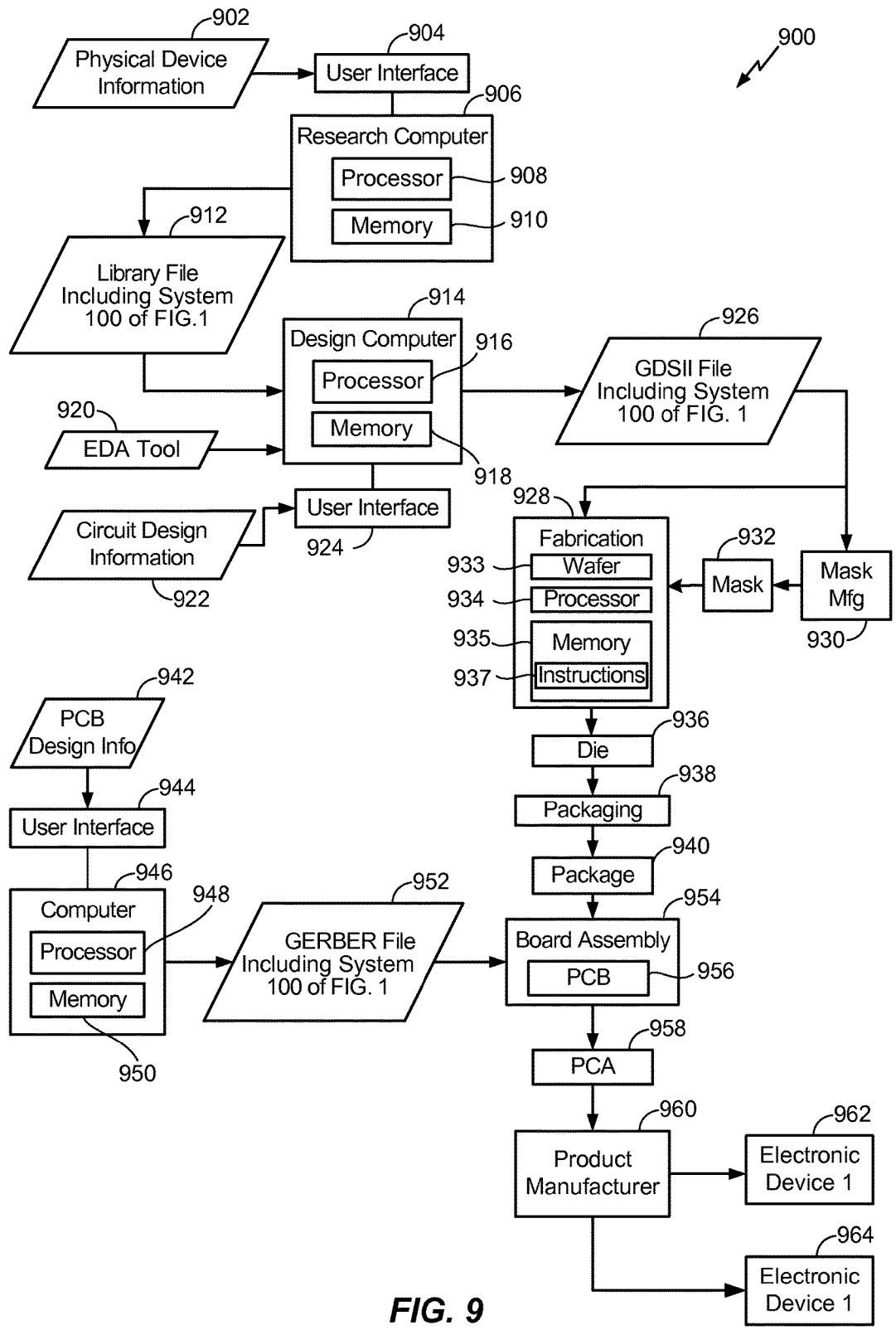
FIG. 9 is a data flow diagram of a particular illustrative embodiment of a manufacturing process to manufacture electronic devices that include a component operable to refresh a memory cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices, such as a communications device (e.g., a mobile phone), a tablet, a laptop, a personal digital assistant (PDA), a set top box, a music player, a video player, an entertainment unit, a navigation device, a fixed location data unit, or a computer. FIG. 9 depicts a particular illustrative embodiment of an electronic device manufacturing process 900.

Physical device information 902 is received at the manufacturing process 900, such as at a research computer 906. The physical device information 902 may include design information representing at least one physical property of a semiconductor device, such as a device that includes the system 100 of FIG. 1, the system 200 of FIG. 2, or any combination thereof. For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including the system 100 of FIG. 1, the system 200 of FIG. 2, or any combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a device that includes the system 100 of FIG. 1, the system 200 of FIG. 2, or any combination thereof, or any combination thereof, of the library file 912. For example, a user of the design computer 914 may enter circuit design information 922 via a user interface 924 coupled to the design computer 914. The circuit design information 922 may include design information representing at least one physical property of a semiconductor device that includes the system 100 of FIG. 1, the system 200 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing a device that includes the system 100 of FIG. 1, the system 200 of FIG. 2, or any combination thereof. To illustrate, the data file may include information corresponding to a system-on-chip (SOC) that includes the system 100 of FIG. 1, the system 200 of FIG. 2, or any combination thereof, and that also includes additional electronic circuits and components within the SOC.

The GDSII file 926 may be received at a fabrication process 928 to manufacture a semiconductor device that includes the system 100 of FIG. 1, the system 200 of FIG. 2, or any combination thereof, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 933, which may be tested and separated into dies, such as a representative die 936. The die 936 includes a circuit including the system 100 of FIG. 1, the system 200 of FIG. 2, or any combination thereof.

In a particular embodiment, the fabrication process 928 may be initiated by or controlled by a processor 934. The processor 934 may access a memory 935 that includes executable instructions 937, such as computer-readable instructions or processor-readable instructions. The executable instructions may include one or more instructions that are executable by a computer, such as the processor 934. The fabrication process 928 may be implemented by a fabrication system that is fully automated or partially automated. For example, the fabrication process 928 may be automated and may perform processing steps according to a schedule. The fabrication system may include fabrication equipment (e.g., processing tools) to perform one or more operations to form an electronic device.

The fabrication system may have a distributed architecture (e.g., a hierarchy). For example, the fabrication system may include one or more processors, such as the processor 934, one or more memories, such as the memory 935, and/or controllers that are distributed according to the distributed architecture. The distributed architecture may include a high-level processor that controls and/or initiates operations of one or more low-level systems. For example, a high-level portion of the fabrication process 928 may include one or more processors, such as the processor 934, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 934.

Alternatively, the processor 934 may be a part of a high-level system, subsystem, or component of the fabrication system. In another embodiment, the processor 934 includes distributed processing at various levels and components of a fabrication system.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including a device that includes the system 100 of FIG. 1, the system 200 of FIG. 2, or any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the system 100 of FIG. 1, the system 200 of FIG. 2, or any combination thereof. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a communications device (e.g., a mobile phone), a tablet, a laptop, a personal digital assistant (PDA), a set top box, a music player, a video player, an entertainment unit, a navigation device, a fixed location data unit, and a computer, into which the system 100 of FIG. 1, the system 200 of FIG. 2, or any combination thereof is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device that includes the system 100 of FIG. 1, the system 200 of FIG. 2, or any combination thereof, may be fabricated, processed, and incorporated into an electronic device, as described in the illustrative process 900. For example, the memory controller 102 of FIG. 1, the first memory device 104 of FIG. 1, the second memory device 106 of FIG. 1, or any combination thereof, may be integrated into a die in an electronic device. The electronic device may include a communications device, a tablet, a laptop, a set top box, a music player, a video player, an entertainment unit, a navigation device, a personal digital assistant (PDA), a fixed location data unit, or a computer. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    comparing a first retention time for first memory cells in a first die of a first memory device to a second retention time for second memory cells in a second die of the first memory device;
    selecting one of the first and second dies as a master die based on the comparison of the first and second retention times, wherein refreshing the first and second memory cells is performed at a refresh rate associated with the one of the first and second dies selected as a master die; and
    sending, during a first time period, a first signal from the first memory device to a memory controller, the memory controller external to the first memory device, wherein the first signal indicates to the memory controller that particular memory cells of the first memory device are to be refreshed, and wherein the first signal includes a refresh location indicator that identifies the particular memory cells.

2. The method of claim 1, wherein the refresh location indicator is sent on a bus, and further comprising receiving an acknowledgment signal from the memory controller via a command bus distinct from the bus.

3. The method of claim 2, further comprising refreshing the particular memory cells in response to receiving the acknowledgement signal.

4. The method of claim 1, further comprising sending, from a second memory device during a second time period, a second signal to the memory controller, wherein the second signal indicates to the memory controller that second particular memory cells of the second memory device are to be refreshed, and wherein the second signal includes a second location indicator that identifies the second particular memory cells.

5. The method of claim 4, wherein the refresh location indicator and the second signal are sent during overlapping clock cycles of the first time period and of the second time period.

6. The method of claim 1, wherein the first memory device includes a timer, and further comprising:
    starting the timer in response to sending the first signal to measure a fixed time period;
    suspending refresh operations associated with the particular memory cells for the fixed time period; and
    refreshing the particular memory cells in response to an expiration of the fixed time period, wherein the fixed time period has a duration of multiple clock cycles.

7. The method of claim 1, further comprising storing, in a first mode register of the first memory device, first refresh data associated with the particular memory cells of the first memory device.

8. The method of claim 7, further comprising storing, in a second mode register of a second memory device, second refresh data associated with a second particular memory cells of the second memory device, wherein the first refresh data indicates a first refresh rate of the particular memory cells, and wherein the second refresh data indicates a second refresh rate of the second particular memory cells.

9. The method of claim 1, wherein sending the first signal to the memory controller is initiated by a processor integrated into the first memory device.

10. The method of claim 1, further comprising
    polling, by the memory controller, respective mode registers of each of the first and second dies to determine a first master refresh rate of the first memory device;
    polling, by the memory controller, respective mode registers of each of the one or more second dies to determine a second master refresh rate of a second memory device; and
    performing refresh operations of the first memory device and the second memory device based on the first master refresh rate and the second master refresh rate, respectively.

11. A method comprising:
    comparing, at a memory controller, a first retention time for first memory cells in a first die of a first memory device to a second retention time for second memory cells in a second die of the first memory device;
    selecting one of the first and second dies as a master die based on the comparison of the first and second retention times, wherein refreshing the first and second memory cells is performed at a refresh rate associated with the one of the first and second dies selected as a master die; and
    receiving, at the memory controller, a first signal sent, during a first time period, from the first memory device, wherein the first signal indicates to the memory controller that particular memory cells of the first memory device are to be refreshed, and wherein the first signal includes a refresh location indicator that identifies the particular memory cells.

12. The method of claim 11, further comprising receiving, at the memory controller, during a second time period, a second signal sent from a second memory device distinct from the first memory device, wherein the second signal indicates to the memory controller that second particular memory cells of the second memory device are to be refreshed, wherein the second signal includes a second refresh location indicator that identifies the second particular memory cells, wherein the first signal and the second signal are received via a bus, and further comprising, in response to receipt of the first signal, refraining, at the memory controller, from sending an acknowledgment signal to the second memory device.

13. The method of claim 12, further comprising:
sending, from the memory controller via a command bus distinct from the bus, a second acknowledgement signal indicating discontinuation of execution of commands associated with the particular memory cells, the second acknowledgement signal sent to the first memory device; and
while sending the second acknowledgment signal, sending, from the memory controller, a third signal corresponding to commands, the third signal sent to the second memory device.

14. The method of claim 11, further comprising:
in response to receiving the first signal, setting a timer associated with the memory controller; and
during a fixed time period measured by the timer, sending commands, from the memory controller, to the first memory device.

15. The method of claim 11, wherein the first die is selected as a master die in response to a determination that the second retention time is greater than the first retention time, wherein the first signal is associated with the master die.

16. The method of claim 11, further comprising sending, from the memory controller, an acknowledgement signal to the first memory device, wherein the acknowledgement signal comprises an indicator to initiate a refresh operation at the first memory device.

17. An apparatus comprising:
a memory controller configured to:
compare a first retention time for first memory cells in a first die of a first memory device to a second retention time for second memory cells in a second die of the first memory device; and
select one of the first and second dies as a master die based on the comparison of the first and second retention times, wherein refreshing the first and second memory cells is performed at a refresh rate associated with the one of the first and second dies selected as a master die, wherein the first memory device is external to the memory controller and is configured to:
send, during a first time period, a first signal to the memory controller, wherein the first signal indicates to the memory controller that particular memory cells of the first memory device are to be refreshed, wherein the first signal includes a refresh location indicator that identifies the particular memory cells of the first memory device; and
refresh the particular memory cells of the first memory device.

18. The apparatus of claim 17, wherein the first signal is sent via a bus, and wherein the memory controller is configured to send an acknowledgement signal to the first memory device in response to receipt of the first signal, the acknowledgement signal sent via a command bus distinct from the bus.

19. The apparatus of claim 18, wherein the first memory device refreshes the particular memory cells of the first memory device in response to receiving the acknowledgement signal, wherein the first memory device, a second memory device, and the memory controller are coupled to the bus, and wherein the memory controller is further configured to refrain from sending a second acknowledgement signal to the second memory device until the particular memory cells of the first memory device are refreshed.

20. The apparatus of claim 17, wherein the first memory device is further configured to:
after sending the first signal, suspend refresh operations associated with the particular memory cells of the first memory device for a fixed time period; and
refresh the particular memory cells of the first memory device in response to an expiration of the fixed time period.

21. The apparatus of claim 20, wherein the first memory device is configured to receive commands from the memory controller after suspension of the refresh operations and prior to initiation of the refresh operations.

22. The apparatus of claim 17, further comprising a communications device, a tablet, a laptop, a set top box, a music player, a video player, an entertainment unit, a navigation device, a personal digital assistant (PDA), a fixed location data unit, a computer, or a combination thereof, into which the first memory device is integrated.

23. The apparatus of claim 17,
wherein the first die includes:
a first temperature sensor configured to monitor a first temperature of first memory cells of the first die;
a first mode register configured to store first data indicating a first retention time associated with the first memory cells; and
a first refresh controller configured to periodically update the first data in response to changes in the first temperature, and
wherein the second die includes:
a second temperature sensor configured to monitor a second temperature of second memory cells of the second die;
a second mode register configured to store second data indicating a second retention time associated with the second memory cells; and
a second refresh controller configured to periodically update the second data in response to changes in the second temperature.

24. The apparatus of claim 23, wherein the memory controller is further configured to periodically track retention time variations between the first retention time of the first memory cells associated with the first die and the second retention time of the second memory cells associated with the second die.

25. The apparatus of claim 24, wherein the memory controller is further configured to:
periodically compare the first retention time to the second retention time; and
in response to a determination that the first retention time is less than the second retention time, send commands to cause the second die to refresh at a same rate as the first die.

26. An apparatus comprising:
a memory controller including a timer and configured to:
compare a first retention time for first memory cells in a first die of a first memory device to a second retention time for second memory cells in a second die of the first memory device;
select one of the first and second dies as a master die based on the comparison of the first and second retention times, wherein refreshing the first and second memory cells is performed at a refresh rate associated with the one of the first and second dies selected as a master die;

receive, during a first time period, a first signal from a first memory device that includes one or more first dies external to the memory controller, wherein the first signal indicates to the memory controller that particular memory cells of the first memory device are to be refreshed, and wherein the first signal includes a refresh location indicator that identifies the particular memory cells;

start the timer in response to receiving the first signal to measure a fixed time period; and discontinue execution of commands associated with the particular memory cells of the first memory device based on the timer indicating the fixed time period has elapsed.

27. The apparatus of claim 26, wherein the memory controller is further configured to refrain from sending an acknowledgement signal in response to receipt, at the memory controller, of the first signal.

28. The apparatus of claim 26, wherein the memory controller is further configured to execute particular commands associated with the particular memory cells of the first memory device for the fixed time period.

29. The apparatus of claim 26, further comprising a semiconductor die into which the memory controller is integrated.

30. The apparatus of claim 26, further comprising a communications device, a tablet, a laptop, a set top box, a music player, a video player, an entertainment unit, a navigation device, a personal digital assistant (PDA), a fixed location data unit, a computer, or a combination thereof, into which the memory controller is integrated.

* * * * *